United States Patent
Makita et al.

(10) Patent No.: US 6,751,450 B2
(45) Date of Patent: Jun. 15, 2004

(54) RADIO APPARATUS CARRYING OUT AUTOMATIC GAIN CONTROL AND GAIN CONTROL METHOD

(75) Inventors: Takaaki Makita, Gifu (JP); Nobuhiro Masaoka, Gifu (JP); Seigo Nakao, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 19 days.

(21) Appl. No.: 10/246,705

(22) Filed: Sep. 19, 2002

(65) Prior Publication Data

US 2003/0058037 A1 Mar. 27, 2003

(30) Foreign Application Priority Data

Sep. 21, 2001 (JP) ........................................ 2001-288953

(51) Int. Cl.[7] .............................. H04B 7/00; H03G 3/20
(52) U.S. Cl. ...................... 455/234.1; 375/345; 329/304
(58) Field of Search ................................. 329/304–310; 375/345; 455/234.1, 239.1, 240.1, 246.1, 247.1

(56) References Cited

U.S. PATENT DOCUMENTS

| | | | |
|---|---|---|---|
| 5,142,695 A | | 8/1992 | Roberts et al. |
| 6,229,397 B1 | * | 5/2001 | Miura ........................ 330/289 |
| 6,392,479 B2 | * | 5/2002 | Miura ........................ 330/129 |

* cited by examiner

Primary Examiner—David Mis
(74) Attorney, Agent, or Firm—Westerman, Hattori, Daniels & Adrian, LLP

(57) ABSTRACT

A fading rate of a mobile terminal unit is estimated by a fading rate estimation unit and an optimum step constant is decided by a step constant determiner depending on the estimated fading rate. This step constant is fed back to a feedback data calculator, so that a reception level can be converged to an ideal level even under a fading environment and the like.

26 Claims, 12 Drawing Sheets

RADIO APPARATUS CARRYING OUT AUTOMATIC GAIN CONTROL AND GAIN CONTROL METHOD

BACKGROUND OF THE INVENTION

1. Field of the Invention

The present invention relates to a radio apparatus and a gain control method, and more particularly to a radio apparatus carrying out Automatic Gain Control (abbreviated as AGC hereinafter) for a signal from a mobile terminal unit in a mobile communication system, and a gain control method for adjusting a gain convergence rate of AGC in the radio apparatus.

2. Description of the Background Art

In a mobile communication system (for example, Personal Handyphone System, abbreviated as PHS hereinafter) which has been rapidly developed in recent years, an approach to extract a signal from a desired mobile terminal unit through adaptive array processing in a radio receiving system at a base station is proposed in communication between the base station and the mobile terminal unit.

The adaptive array processing is processing to remove an interference component and correctly extract a signal from a desired mobile terminal unit by calculating a weight vector consisting of a reception coefficient (weight) for each antenna at a base station based on a received signal from a mobile terminal unit, for adaptive control.

The adaptive array processing requires a plurality of spatially distributed antennas, that is, an array antenna. In an array antenna, for example, formed of two antennas, an array output signal $Y(t)$ is expressed as follows:

$$Y(t)=W1X1(t)+W2X2(t)$$

where $X1(t)$, $X2(t)$ each represents a received signal at each antenna, and $W1$, $W2$ each represents a weight at each antenna.

The received signal at each antenna is expressed as follows:

$$X1(t)=H11S1(t)+H12S2(t)+n1(t)$$

$$X2(t)=H21S1(t)+H22S2(T)+n2(t)$$

where $S1(t)$ represents a signal from a desired mobile terminal unit and $S2(t)$ represents a signal from an interference-causing mobile terminal unit.

Here, H11 represents a propagation path property from the desired mobile terminal unit to antenna 1, and H12 represents a propagation path property from the interference-causing mobile terminal unit to antenna 1. H21 represents a propagation path property from the desired mobile terminal unit to antenna 2, and H22 represents a propagation path property from the interference-causing mobile terminal unit to antenna 2. In addition, $n1(t)$ represents noise at a receiving system of antenna 1, and $n2(t)$ represents noise at the system of antenna 2. The array output in this case is expressed as follows:

$$Y(t) = (W1H11+ W2H21)S1(t) +$$
$$(W1H21+ W2H22)S2(t) +$$
$$W1n1(t) + W2n2(t).$$

Here, it is assumed that the weight that satisfies the following equation can be calculated:

$$(W1H11+W2H21)=1$$

$$(W1H21+W2H22)=0.$$

Accordingly, the array output signal can be expressed as follows:

$$Y(t)=S1(t)+n(t)$$

where $n(t)=W1n1(t)+W2n2(t)$.

Thus, the interference component can be removed and the signal can be received from the desired mobile terminal unit by calculating the appropriate weight through the adaptive array processing.

FIG. 11 is a functional block diagram functionally illustrating a radio apparatus that is provided for each antenna at a conventional base station carrying out the adaptive array processing using such a plurality of antennas and carries out AGC for a signal from a mobile terminal unit. FIG. 12 is a flow chart illustrating a gain control method for adjusting a gain convergence rate of AGC in such a radio apparatus.

First referring to FIG. 11, a signal received from an antenna 1 is amplified by an AGC amplifier 2, converted into an IQ signal formed of an In-phase component (I component) and Quadrature component (Q component) by a quadrature detector 3, and thereafter stored into memory 4.

IQ signal once stored in memory 4 is provided to a demodulation circuit 5. Demodulation circuit 5 also receives IQ signal from another antenna (not shown), performs the adaptive array processing as described above and demodulation processing and extracts the signal from each mobile terminal unit.

A reception level detection unit 6 obtains the reception level of the signal from IQ signal stored in memory 4. An amplitude value of IQ signal is calculated, for example, for eight symbols from 60th symbol of the received signal for each frame. The maximum amplitude value for these eight symbols is considered as the reception level for that frame.

A feedback data calculator 7 calculates feedback data that decides an amplitude ratio of AGC amplifier 2 in the next frame by the reception level obtained by reception level detection unit 6 and a step constant stored in memory 9. Here, when the reception level obtained by reception level detection unit 6 is represented by P_max, a prescribed ideal value is represented by P_ideal, and the step constant is represented by Step, the amount of change ΔFB from feedback data at the time of receiving the previous frame to feedback data at the time of receiving the next frame can be calculated by the following equation:

$$\Delta FB=(P\_max-P\_ideal)/2^{Step}.$$

When the value of the feedback data at the time of receiving the previous frame is represented by FB, feedback data FB' at the time of receiving the next frame can be expressed as follows:

$$FB'=FB-\Delta FB.$$

The feedback data calculated by feedback data calculator 7 is once stored in memory 8. The stored feedback data is read in the next frame and provided to a gain control input of AGC amplifier 2 to be reflected in AGC at the time of receiving the next frame.

Referring to FIG. 12, the gain control method for adjusting the gain convergence rate of AGC in the radio apparatus shown in FIG. 11 will now be described. It is noted that the following process is implemented by a Digital Signal Processor (DSP) of the radio apparatus in a software manner.

At step S1, the signal from the mobile terminal unit is subjected to quadrature detection. Here, an RXIF signal that is an intermediate frequency signal received from the mobile terminal unit is converted to an RXIQ signal subjected to quadrature detection.

At step S2, such a symbol is set in that the reception level of the signal received from the mobile terminal unit starts to be detected. An example is herein shown where the reception level is detected from 60th symbol of the received signal.

At step S3, it is determined whether the present symbol is in a symbol period in which the reception level of the signal from the mobile terminal unit is detected. For example, when the reception level is detected in the 8-symbol period from the 60th symbol to the 67th symbol, if the symbol in which amplitude will be calculated from now on precedes the 68th symbol, a process of calculating the amplitude in that symbol will follow, and if not, a process of calculating the feedback data will follow.

At step S4, the amplitude in that symbol is calculated. The value of squared I component of IQ signal is added to the value of squared Q component of IQ signal. Here, in order to simplify the process, the square roots of the resulting sum is not obtained.

At step S5, it is determined whether or not amplitude A calculated at step S4 is greater than the maximum amplitude A_max stored until now.

At step S6, if it is determined that A is greater than A_max at step S5, A_max is replaced by A.

At step S7, the symbol in which the amplitude is calculated is shifted by one in ascending order.

At step S8, the amount of change of the feedback data is calculated from the maximum amplitude value of the amplitudes from the 60th symbol to 67th symbol and from a fixed step constant stored in the memory.

At step S9, the feedback data in the next frame is calculated and the calculated feedback data is reflected in AGC at the time of receiving the next frame.

In the adaptive array processing, weights are calculated such that the power of interference component is small when the signals received from a plurality of antennas are multiplied by respective weights to be synthesized. Specifically, the operation of multiplying the weight means that the amplitude and phase of the signal received from each antenna are adjusted appropriately. Therefore, if the amplitude and phase information of the received signal suffers an error due to waveform distortion and the like, the adaptive array processing cannot fully function.

On the other hand, as to the input/output characteristics of general amplifiers, output at a certain level causes saturation, thereby creating a non-linear region. Therefore, in a case where the feedback data is calculated based on the fixed step constant as described above, for example, if the reception level of the signal from the mobile terminal unit is largely fluctuated by the effects of a distance between the base station and the mobile terminal unit, any possible obstacle, fading, and the like, the amplifier (AGC amplifier 2) at the base station enters into this non-linear region, leading to distortion of the received waveform, thereby resulting in that the adaptive array processing cannot fully function.

SUMMARY OF THE INVENTION

It is therefore an object of the present invention to provide a radio apparatus and a gain control method allowing for an adaptive array processing without a non-linear operation of an amplifier even under an environment in which a reception level of a signal from a mobile terminal unit largely fluctuates due to the effects of a distance between a base station and the mobile terminal unit, any obstacle, fading, and the like.

In accordance with the present invention, a radio apparatus carrying out AGC for a signal from a mobile terminal unit includes: a gain control feedback circuit performing AGC on the signal depending on a level of the signal; a fading rate estimation unit estimating a fading rate of the mobile terminal unit; and a step constant determiner determining an optimum step constant which decides a gain of the gain control feedback circuit depending on the fading rate estimated by the fading rate estimation unit. The gain control feedback circuit includes a feedback data calculator calculating feedback data which defines a gain of the gain control feedback circuit based on the signal level and the optimum step constant as determined by the step constant determiner.

Preferably, the fading rate estimation unit calculates a reception response vector of the signal from the mobile terminal unit and estimates a fading rate from a correlation value of the reception response vectors between frames.

More preferably, the step constant determiner decides an optimum step constant at the fading rate estimated by the fading rate estimation unit based on an association table of preliminarily obtained fading rates and step constants.

More preferably, the feedback data calculator calculates feedback data in a next frame by obtaining a value of difference between a value of the signal level and an ideal value, dividing the value of difference by a prescribed constant a number of times corresponding to the step constant, followed by multiplication by a prescribed coefficient, thereby calculating an amount of change in feedback data, and adding the amount of change to feedback data at the time of receiving a previous frame.

In accordance with another aspect of the present invention, a radio apparatus carrying out AGC for a signal from a mobile terminal unit includes: a gain control feedback circuit performing AGC on the signal depending on a level of the signal; a received signal strength detection unit detecting a received signal strength of the signal from the mobile terminal unit, at an antenna end of the radio apparatus; a feedback data conversion unit carrying out conversion from the received signal strength detected by the received signal strength detection unit to optimum feedback data which decides a gain of the gain control feedback circuit based on an association table of preliminarily obtained received signal strengths and feedback data; and a feedback data switch unit selecting the optimum feedback data converted by the feedback data conversion unit as an initial value of feedback data of the gain control feedback circuit.

In accordance with a further aspect of the present invention, a radio apparatus carrying out AGC for a signal from a mobile terminal unit includes a gain control feedback circuit performing AGC on the signal depending on a level of the signal. The gain control feedback circuit includes a first gain control circuit supplying first feedback data allowing the level of the signal to converge to an ideal value slowly, and a second gain control circuit supplying second feedback data allowing the level of the signal to converge to an ideal value fast. The radio apparatus further includes a received signal strength detection unit detecting a received signal strength of the signal from the mobile terminal unit, at an antenna end of the radio apparatus, and a feedback data switch unit selecting the first feedback data or the second feedback data depending on a detection result from the received signal strength detection unit.

Preferably, the feedback data switch unit makes a switch from the first feedback data to the second feedback data when fluctuation of the received signal strength detected by the received signal strength detection unit decreases to a prescribed threshold or below or increases to a prescribed threshold or above.

In accordance with yet another aspect of the present invention, a radio apparatus carrying out AGC for a signal from a mobile terminal unit includes a gain control feedback circuit performing AGC on the signal depending on a level of the signal. The gain control feedback circuit includes a first gain control circuit supplying first feedback data allowing the level of the signal to converge to an ideal value slowly, and a second gain control circuit supplying second feedback data allowing the level of the signal to converge to an ideal value fast. The radio apparatus further includes a new terminal detector detecting whether a signal is received from a new mobile terminal unit, and a feedback data switch unit selecting the first feedback data or the second feedback data depending on a detection result from the new terminal detector.

Preferably, the new terminal detector includes a demodulation circuit demodulating a specific signal from a new mobile terminal unit and an error determiner determining whether an error exists in the signal demodulated by the demodulation circuit and if no error exists, determining that a signal is received from a new mobile terminal unit.

More preferably, the error determiner determines that a signal has been received from a new mobile terminal unit if a unique word error does not exist in the signal demodulated in the demodulation circuit.

More preferably, the error determiner determines that a signal has been received from a new mobile terminal unit if the number of bit errors in a preamble portion is equal to or smaller than a prescribed threshold in the signal demodulated in the demodulation circuit.

More preferably, the gain control feedback circuit includes a reception level detection unit detecting the level of the signal. The reception level detection unit calculates an amplitude value for each IQ signal during a prescribed period of a received signal and regards a maximum amplitude value among the amplitude values as a reception level of the received signal.

More preferably, the gain control feedback circuit includes a reception level detection unit detecting the level of the signal. The reception level detection unit calculates an amplitude value for each IF signal during a prescribed period of a received signal and regards a maximum amplitude value among the amplitude values as a reception level of the received signal.

In accordance with another aspect of the present invention, a gain control method in a radio apparatus carrying out AGC for a signal from a mobile terminal unit includes the steps of: performing AGC on the signal depending on a level of the signal; estimating a fading rate of the mobile terminal unit; and determining an optimum step constant which decides a gain of AGC, depending on the estimated fading rate. The step of carrying out AGC includes the step of calculating feedback data which defines a gain of AGC, based on the signal level and the optimum step constant as determined.

Preferably, the step of estimating a fading rate includes the step of calculating a reception response vector of the signal from the mobile terminal unit and estimating a fading rate from a correlation value of the reception response vectors between frames.

More preferably, the step of determining an optimum step constant includes the step of deciding an optimum step constant at the estimated fading rate based on an association table of preliminary obtained fading rates and step constants.

More preferably, the step of calculating feedback data includes the step of calculating feedback data in a next frame by obtaining a value of difference between a value of the signal level and an ideal value, dividing the value of difference by a prescribed constant a number of times corresponding to the step constant, followed by multiplication by a prescribed coefficient, thereby calculating an amount of change of feedback data, and adding the amount of change to feedback data at the time of receiving a previous frame.

In accordance with a further aspect of the present invention, a gain control method in a radio apparatus carrying out AGC for a signal from a mobile terminal unit includes the steps of: performing AGC on the signal depending on a level of the signal; detecting a received signal strength of the signal from the mobile terminal unit at an antenna end of the radio apparatus; carrying out conversion from the detected, received signal strength to optimum feedback data which decides a gain of AGC based on an association table of preliminarily obtained received signal strengths and feedback data; and selecting the converted optimum feedback data as an initial value of feedback data.

In accordance with yet another aspect of the present invention, a gain control method in a radio apparatus carrying out AGC for a signal from a mobile terminal unit includes the step of performing AGC on the signal depending on a level of the signal. The step of performing AGC includes a first step of supplying first feedback data allowing the level of the signal to converge to an ideal value slowly, and a second step of supplying second feedback data allowing the level of the signal to converge to an ideal value fast. The method further includes the steps of detecting a received signal strength of the signal from the mobile terminal unit, at an antenna end of the radio apparatus, and selecting the first feedback data or the second feedback data depending on a detection result.

Preferably, the step of selecting feedback data includes the step of making a switch from the first feedback data to the second feedback data when fluctuation of the detected, received signal strength decreases to a prescribed threshold or below or increases to a prescribed threshold or above.

In accordance with a still further aspect of the present invention, a gain control method in a radio apparatus carrying out AGC for a signal from a mobile terminal unit includes the step of performing AGC on the signal depending on a level of the signal. The step of performing AGC includes a first step of supplying first feedback data allowing the level of the signal to converge to an ideal value slowly, and a second step of supplying second feedback data allowing the level of the signal to converge to an ideal value fast. The method further includes the steps of detecting whether a signal is received from a new mobile terminal unit, and selecting the first feedback data or the second feedback data depending on a detection result.

Preferably, the step of detecting a new mobile terminal unit includes the steps of demodulating a specific signal from a new mobile terminal unit, and determining whether an error exists in the demodulated signal and if no error exists, determining that a signal is received from a new mobile terminal unit.

More preferably, the step of determining whether an error exists includes the step of determining that a signal has been received from a new mobile terminal unit when a unique word error does not exist in the demodulated signal.

More preferably, the step of determining whether an error exists includes the step of determining that a signal has been received from a new mobile terminal unit if the number of bit errors in a preamble portion is equal to or smaller than a prescribed threshold in the demodulated signal.

More preferably, the step of performing AGC includes the step of detecting a level of the signal. The step of detecting a level of the signal includes the step of calculating an amplitude value for each IQ signal during a prescribed period of a received signal and regarding a maximum amplitude value among the amplitude values as a reception level of the received signal.

More preferably, the step of performing AGC includes the step of detecting a level of the signal. The step of detecting a level of the signal includes the step of calculating an amplitude value for each IF signal during a prescribed period of a received signal and regarding a maximum amplitude value among the amplitude values as a reception level of the received signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
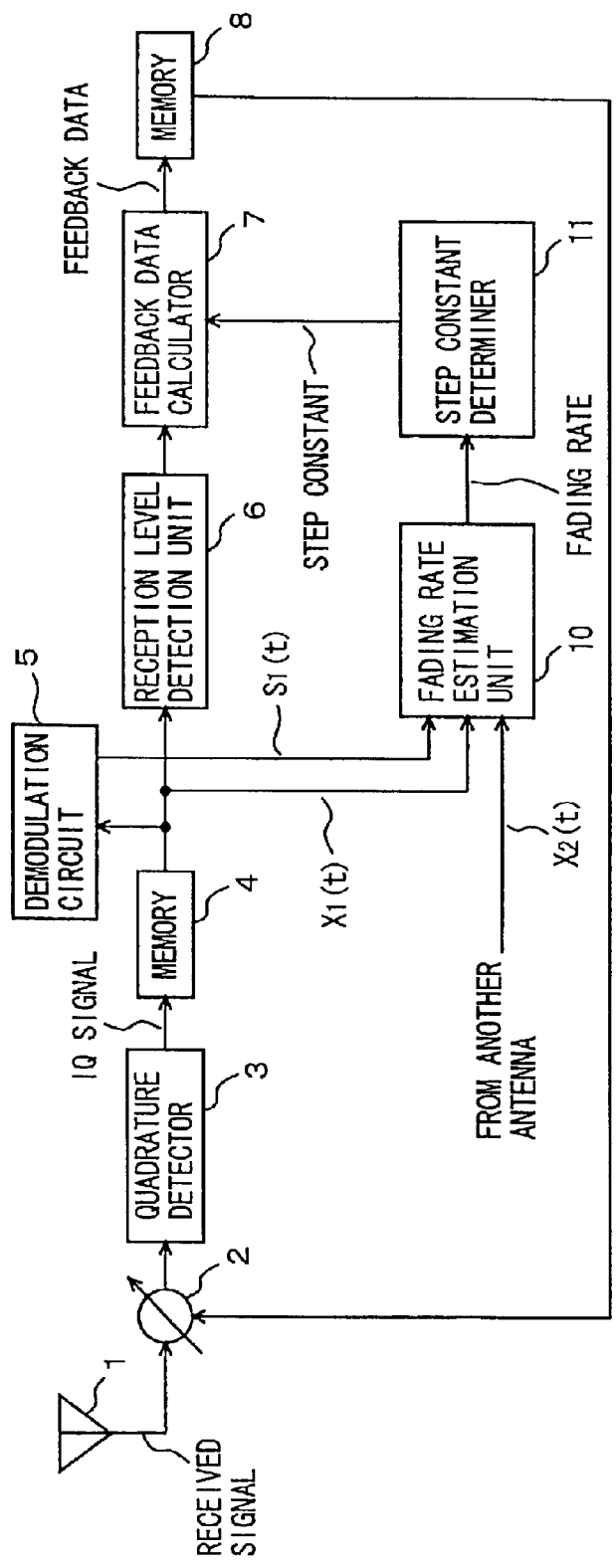
FIG. 1 is a functional block diagram functionally illustrating a radio apparatus in accordance with a first embodiment of the present invention.

In the following, embodiments of the present invention will be described in detail with reference to the figures. It is noted that in the figures the same or corresponding parts will be denoted with the same reference characters and description thereof will not be repeated.

(First Embodiment)

Figure 2:
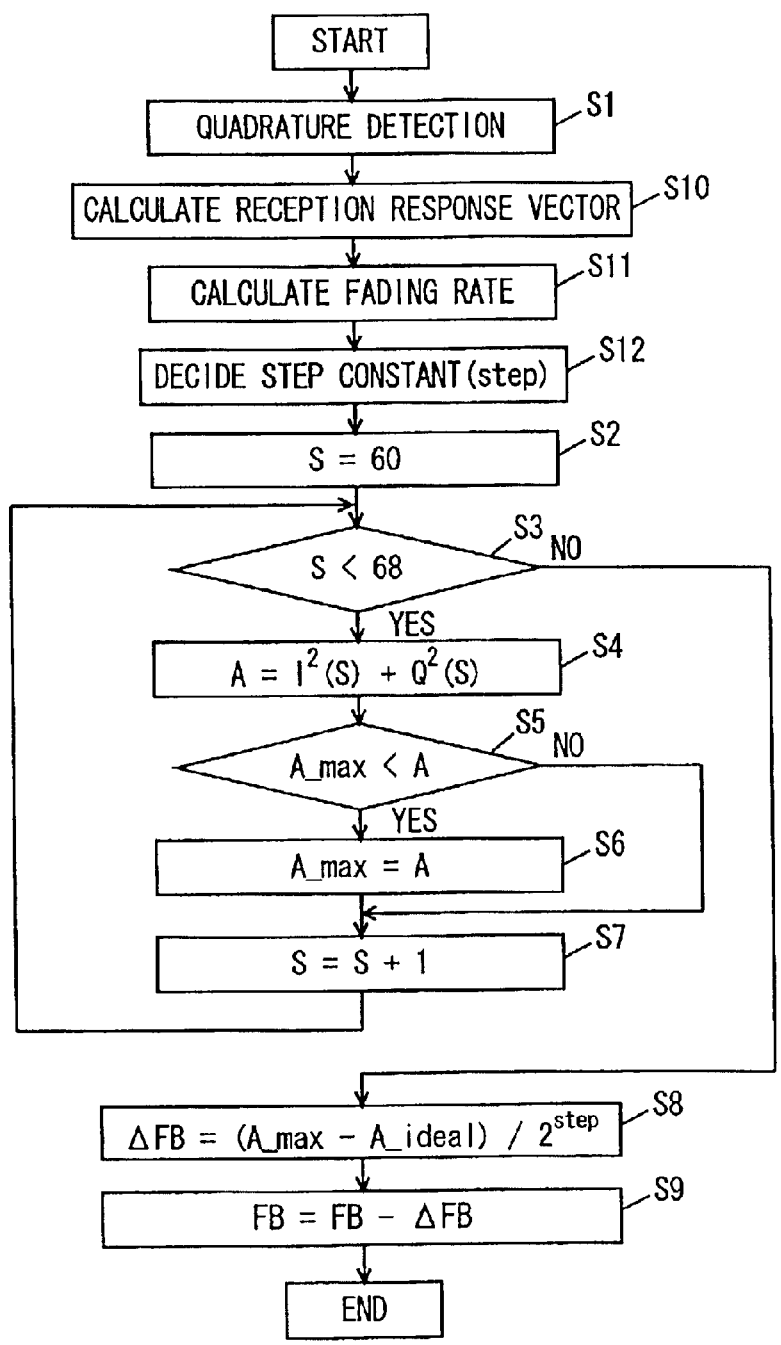
FIG. 2 is a flow chart illustrating a gain control method in accordance with the first embodiment of the present invention.

FIG. 1 is a functional block diagram functionally illustrating a radio apparatus in accordance with a first embodiment of the present invention. FIG. 2 is a flow chart illustrating a gain control method in accordance with the first embodiment of the present invention.

Figure 11:
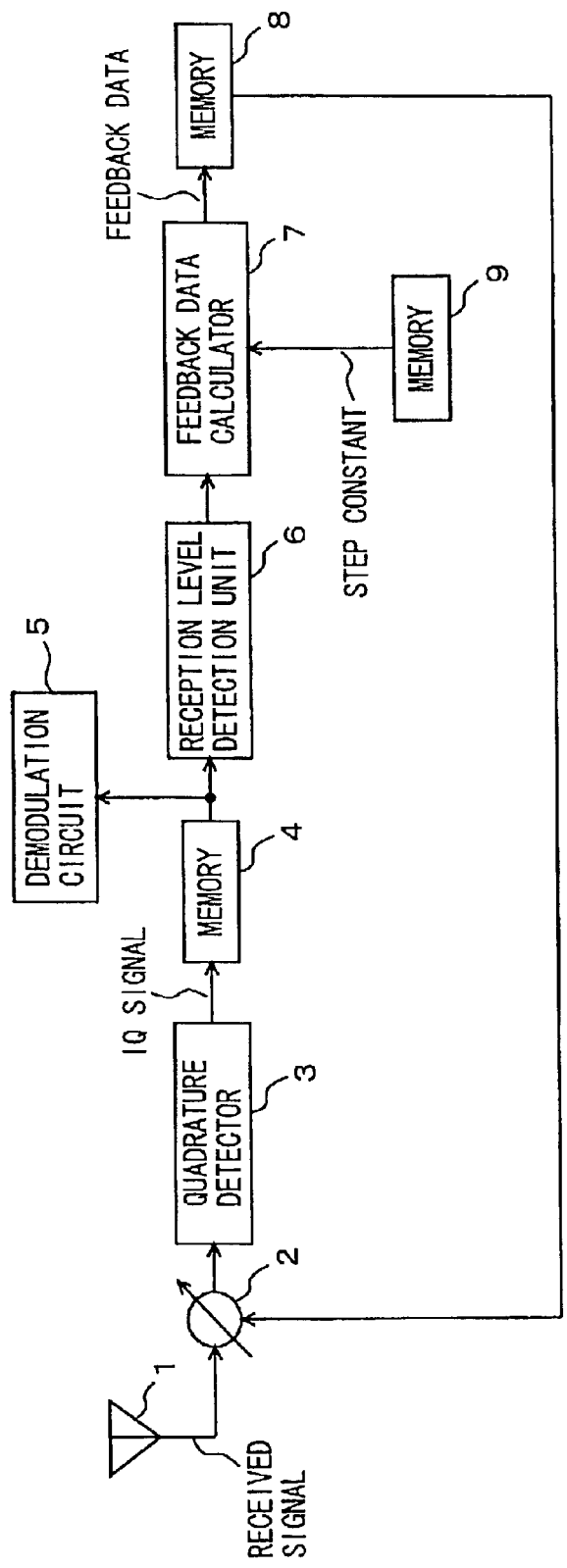
FIG. 11 is a functional block diagram functionally illustrating a conventional radio apparatus carrying out AGC for a signal from a mobile terminal unit.

The radio apparatus shown in FIG. 1 is same as the radio apparatus shown in FIG. 11 except the following point. Specifically, the radio apparatus shown in FIG. 1 includes a fading rate estimation unit 10 and a step constant determiner 11 in place of memory 9 in FIG. 11.

Fading rate estimation unit 10 estimates a fading rate by a correlation value of reception response vectors of the signal from a mobile terminal unit.

The reception response vector is calculated by fading rate estimation unit 10 as follows. For the purpose of illustration, it is assumed that a signal from a desired mobile terminal unit is received at an array antenna formed of two antennas. The signal from the mobile terminal unit is represented by S1(t), the signal received from an antenna 1 is represented by X1(t), the signal received from another antenna (not shown) is represented by X2(t), a noise component of antenna 1 is represented by n1(t), and a noise component from another antenna is represented by n2(t).

Here the received signal at each antenna is expressed as follows:

$$X1(t)=h1S1(t)+n1(t)$$

$$X2(t)=h2S1(t)+n2(t).$$

Here, h1 and h2 are parameters expressed in complex numbers including amplitudes and phases, representing a propagation path from the desired mobile terminal unit to antenna 1 and a propagation path from the desired mobile terminal unit to another antenna, respectively.

Here, reception response vector H of signal S1(t) is expressed in the following equation:

$$H=[h1, h2]T (T \text{ is transpose}).$$

In this case, there is no correlation between S1(t), n1(t) and n2(t).

Furthermore, assuming that signal S1(t) is created as a reference signal r1(t), h1(t) is calculated based on the following equation, by multiplying received signal X1(t) by reference signal r1*(t) (* is a complex conjugate) and obtaining an ensemble-average:

$$E[X1(t)r1(t)] = E[X1(t)S1(t)]$$
$$= E[h1S1(t)S1^*(t)] + E[n1(t)S1^*(t)]$$
$$= h1E[S1(t)S1^*(t)] + E[n1(t)S1^*(t)]$$
$$\approx h1.$$

Here, the ensemble-average of the identical signals is one and the ensemble-average of the signals not correlated is approximately zero, so that $E[S1(t)S1^*(t)]=1$, $E[n1(t)S1^*(t)] \approx 0$.

Similarly, h2 is calculated by multiplying received signal X2(t) by reference signal r1*(t) and obtaining an ensemble-average. Thus reception response vector H of signal S1(t) from the desired mobile terminal unit is calculated.

In this manner, fading rate estimation unit 10 first calculates the reception response vector of the signal from the mobile terminal unit and further calculates a fading rate based on the calculated reception response vector. A method of estimating a fading rate will be described below.

The reception response vector of the signal from the mobile terminal unit in one frame is represented by H(f), and the reception response vector from the mobile terminal unit in the next frame is represented by H(f+1). As described above, the reception response vector indicates the propagation path from the mobile terminal unit to the base station. When the fading rate is low, H(f) and H(f+1) have a similar value and the correlation value of the reception response vectors becomes greater because fluctuations in the propagation path are small. On the contrary, when the fading rate is high, H(f) and H(f+1) have different values and the correlation value of the reception response vectors becomes smaller because fluctuations in the propagation path are large.

Then, the correlation value between frames of the reception response vectors of the signal from the mobile terminal unit is obtained beforehand for each of a plurality of fading rates, and a table associating the fading rates with the correlation values of the reception response vectors is stored in memory (not shown), which is provided in fading rate estimation unit 10. In actual communication, fading rate estimation unit 10 calculates the reception response vector of the signal from the mobile terminal unit every frame through the method described above and obtains the correlation value of the reception response vectors between frames. The fading rate of the mobile terminal unit can be estimated from that correlation value with reference to the association table with the fading rates as described above.

Step constant determiner 11 decides an optimum step constant depending on the fading rate of the mobile terminal unit that is estimated by fading rate estimation unit 10.

The optimum step constant depending on the fading rate is decided as follows. First, the reception levels of the signal from the mobile terminal unit at a fading rate are observed for a prescribed number of frames with the step constants being varied, and a step constant having a reception level closest to an ideal value with smallest dispersion is regarded as the optimum step constant at that fading rate.

The table in which the fading rates are associated with the optimum step constants can be created by performing the following procedures on a plurality of fading rates. This association table is stored in memory or the like (not shown) to form step constant determiner 11. The step constant read from step constant determiner 11 is applied to feedback data calculator 7.

Figure 12:
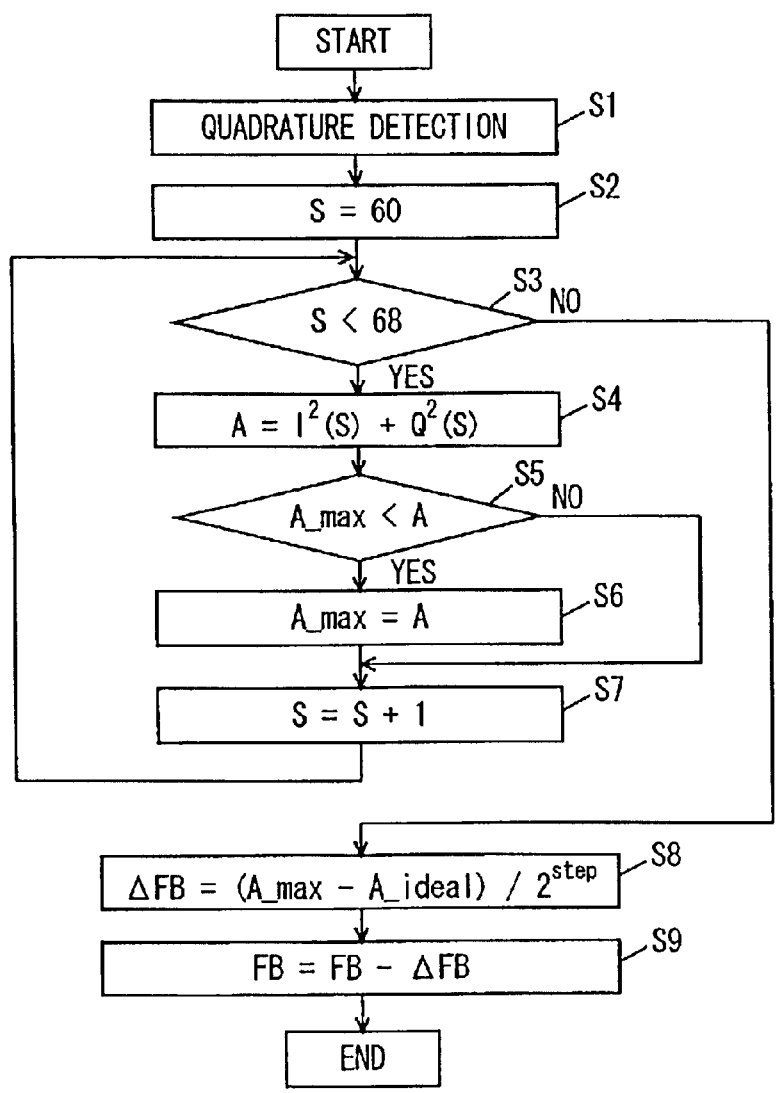
FIG. 12 is a flow chart illustrating a gain control method for adapting a gain convergence rate of AGC in the conventional radio apparatus shown in FIG. 11.

Referring to FIG. 2, the gain control method in accordance with the first embodiment will now be described. The flow chart in FIG. 2 is different from the flow chart of the conventional example shown in FIG. 12 in the following points.

First at step S10, a reception response vector is calculated based on a signal from a mobile terminal unit.

At step S11, a fading rate is calculated based on the reception response vector calculated at step S10.

At step S12, a step constant is decided based on the fading rate calculated at step S11.

In this manner, in accordance with the first embodiment, non-linear operation of AGC amplifier 2 due to the effect of fading can be prevented by deciding a step constant depending on the fading rate rather than a fixed step constant.

(Second Embodiment)

Figure 3:
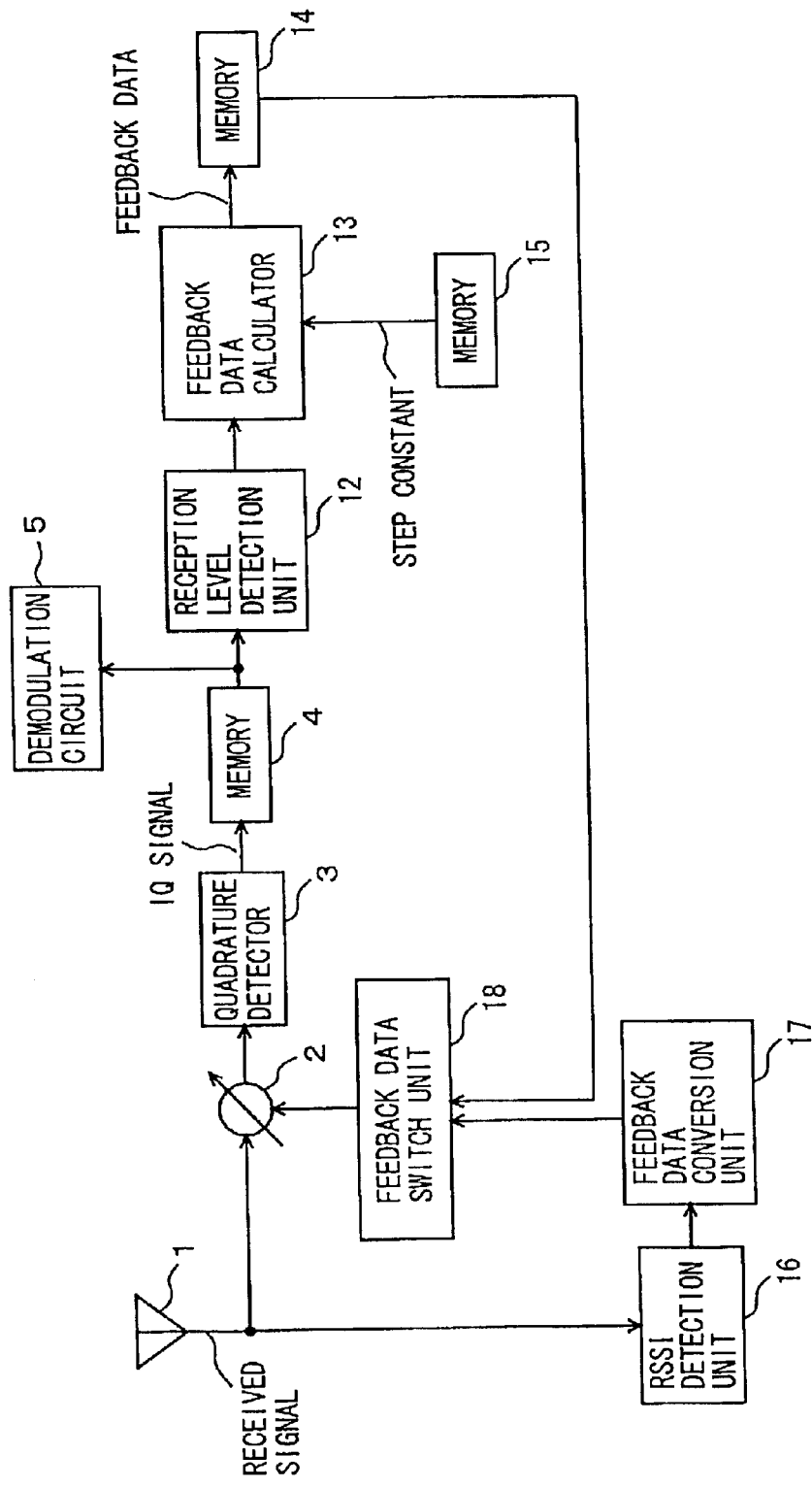
FIG. 3 is a functional block diagram functionally illustrating the radio apparatus in accordance with a second embodiment of the present invention.
Figure 4:
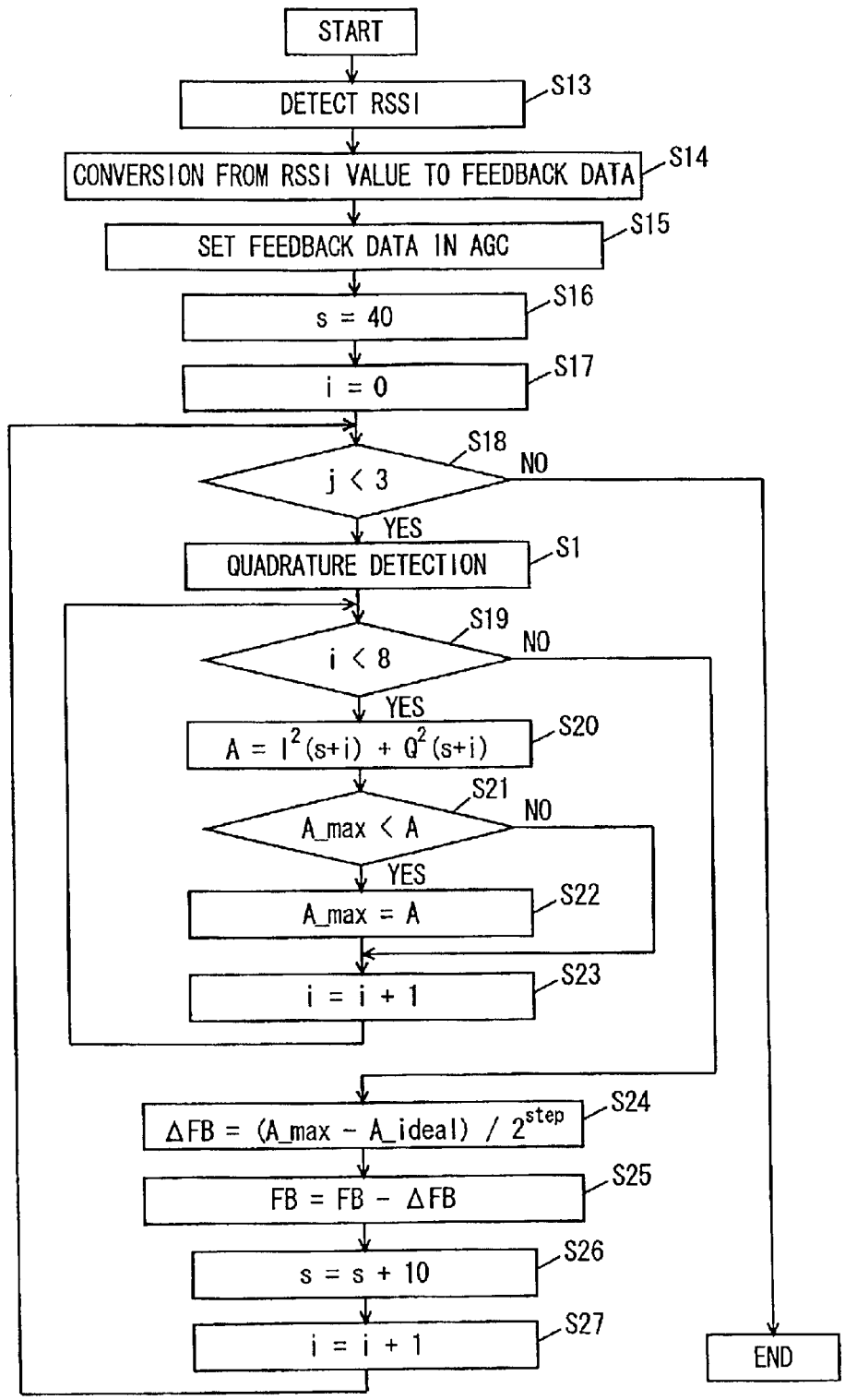
FIG. 4 is a flow chart illustrating the gain control method in accordance with the second embodiment of the present invention.

FIG. 3 is a functional block diagram functionally illustrating the radio apparatus in accordance with a second embodiment of the present invention. FIG. 4 is a flow chart illustrating the gain control method in accordance with the second embodiment of the present invention.

First referring to FIG. 3, the signal received from antenna 1 is amplified by AGC amplifier 2, converted to IQ signal by quadrature detector 3 and thereafter stored in memory 4.

An RSSI detection unit 16 detecting a received signal strength (for example, a received signal strength indicator: abbreviated as RSSI hereinafter) detects the RSSI of the signal received from the mobile terminal unit at antenna 1 in real time.

A feedback data conversion unit 17 obtains associated feedback data from the RSSI of the signal from the mobile terminal unit that is detected by RSSI detection unit 16. A feedback data switch unit 18 operates to select and provide the output of feedback data conversion unit 17 to the gain control input of AGC amplifier 2 at the start of reception. An initial value of AGC gain is thus set.

Feedback data conversion unit 17 is configured as follows. The feedback data is varied with the signal level from the mobile terminal unit being kept constant, and feedback data is obtained such that the reception level of the signal that has passed through AGC amplifier 2 attains an ideal value. The associated feedback data is obtained with varying the level of the signal from the mobile terminal unit which is kept constant. An association table of RSSI and feedback can thus be created and stored in memory or the like (not shown). In this manner, feedback data conversion unit 17 can be configured.

Reception level detection unit 12 calculates a reception level with IQ signal that has passed through quadrature detector 3. The amplitudes of IQ signal are calculated, for example, during a 4-sample period after setting of the initial value, and the maximum amplitude value among these is regarded as the reception level at that moment.

A feedback data calculator 13 calculates feedback data with the reception level obtained by reception level detection unit 12 and the step constant stored in memory 15. Here, the amount of change $\Delta FB$ from feedback data at the time of receiving a previous frame to feedback data at the time of receiving a next frame can be calculated as follows:

$$\Delta FB = (P\_max - P\_ideal)/2^{Step}$$

where the reception level obtained by reception level detection unit 12 is represented by P_max, a prescribed ideal value by P_ideal, and the step constant by Step.

Therefore, when the value of the feedback data at the time of receiving the previous frame is represented by FB, the feedback data FB' at the time of receiving the next frame can be calculated as follows:

$$FB'=FB-\Delta FB.$$

The feedback data calculated by feedback data calculator 13 is once stored in memory and thereafter provided to the gain control input of AGC gain amplifier 2 through feedback data switch unit 18. Since the initial value of AGC gain of AGC amplifier 2 is properly set, the feedback data is immediately reflected in AGC.

Referring to FIG. 4, the gain control method in accordance with the second embodiment will now be described.

First at step S13, RSSI of a signal received from a mobile terminal unit at an antenna end is detected.

At step S14, conversion from the RSSI detected at step S13 to feedback data is carried out. With reference to the memory storing the association table of RSSI and feedback data, feedback data associated with the RSSI detected at step S13 is retrieved.

At step S15, the feedback data obtained at step S14 is immediately reflected in AGC. More specifically, the feedback data obtained at step S14 is provided to the gain control input of AGC amplifier 2 as an initial value.

At step S16, s indicative of the nth sample at which calculation of amplitude value starts is set. More specifically, at step S16, the ordinal position of the sample at which a burst rising of the signal from the mobile terminal unit is detected is set. Here, it is assumed that the burst rising is detected at the 40th sample.

At step S17, j represents the number of times feedback data is set by detecting the reception level from the mobile terminal unit.

At step S18, if the number of times feedback data is set by detecting the reception level is not less than three, the process will end, and if not, the subsequent process will follow.

At step S19, it is determined whether the present sample is in a sample period during which the reception level of the signal from the mobile terminal unit is detected. In a case where the reception level is detected during an 8-sample period from the sample specified by s, for example, if the sample at which an amplitude will be calculated precedes the eighth sample from the sample specified by s, a process of calculating the amplitude of that sample will follow. If not, a process of calculating the feedback data will follow.

At step S20, the amplitude of the corresponding symbol is calculated. The value of squared I component of IQ signal is added to the value of squared Q component of IQ signal. Here, for the purpose of simplifying the process, the square roots of the resulting sum is not obtained.

At step S21, it is determined whether amplitude A calculated at step S20 is greater than the maximum amplitude A_max stored until now.

At step S22, if it is determined that A is greater than A_max at step S21, A_max is replaced by A.

At step S23, the sample at which the amplitude is calculated is shifted by one in ascending order.

At step S24, the amount of change of the feedback data is calculated based on the maximum amplitude value during the 8-sample period from the sample specified by s and the step constant.

At step S25, the feedback data in the next frame is calculated and the calculated feedback data is immediately reflected in AGC.

At step S26, the sample at which amplitude is calculated next is set.

At step S27, the number of times the feedback data is set is updated.

In this manner, according to the second embodiment, the initial value of AGC gain is set depending on RSSI at the start of reception, so that the feedback data calculated by feedback calculator 13 and feedback data conversion unit 17 can be immediately reflected in AGC.

(Third Embodiment)

Figure 5:
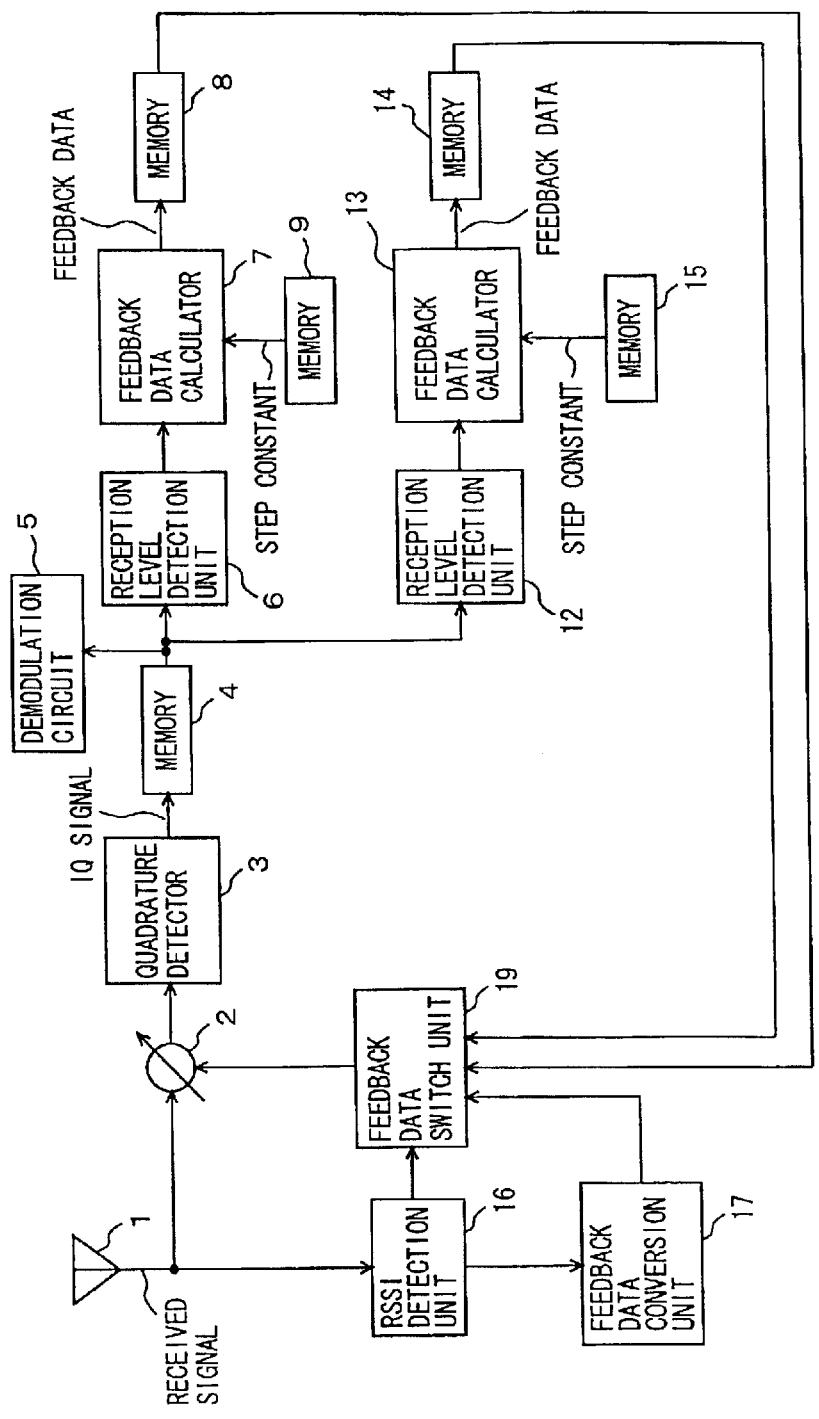
FIG. 5 is a functional block diagram functionally illustrating the radio apparatus in accordance with a third embodiment of the present invention.
Figure 6:
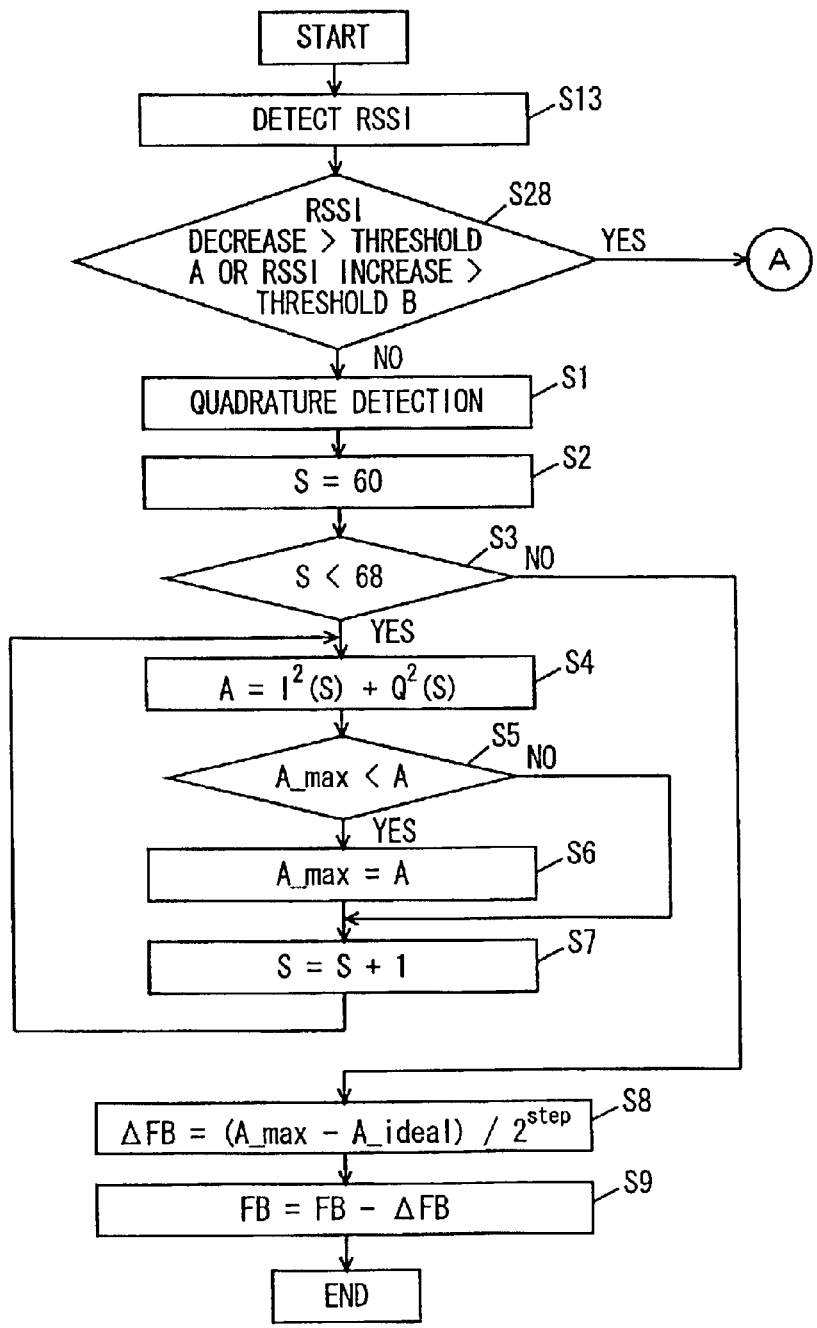
FIG. 6 is a flow chart partially illustrating the gain control method in accordance with the third embodiment of the present invention.
Figure 7:
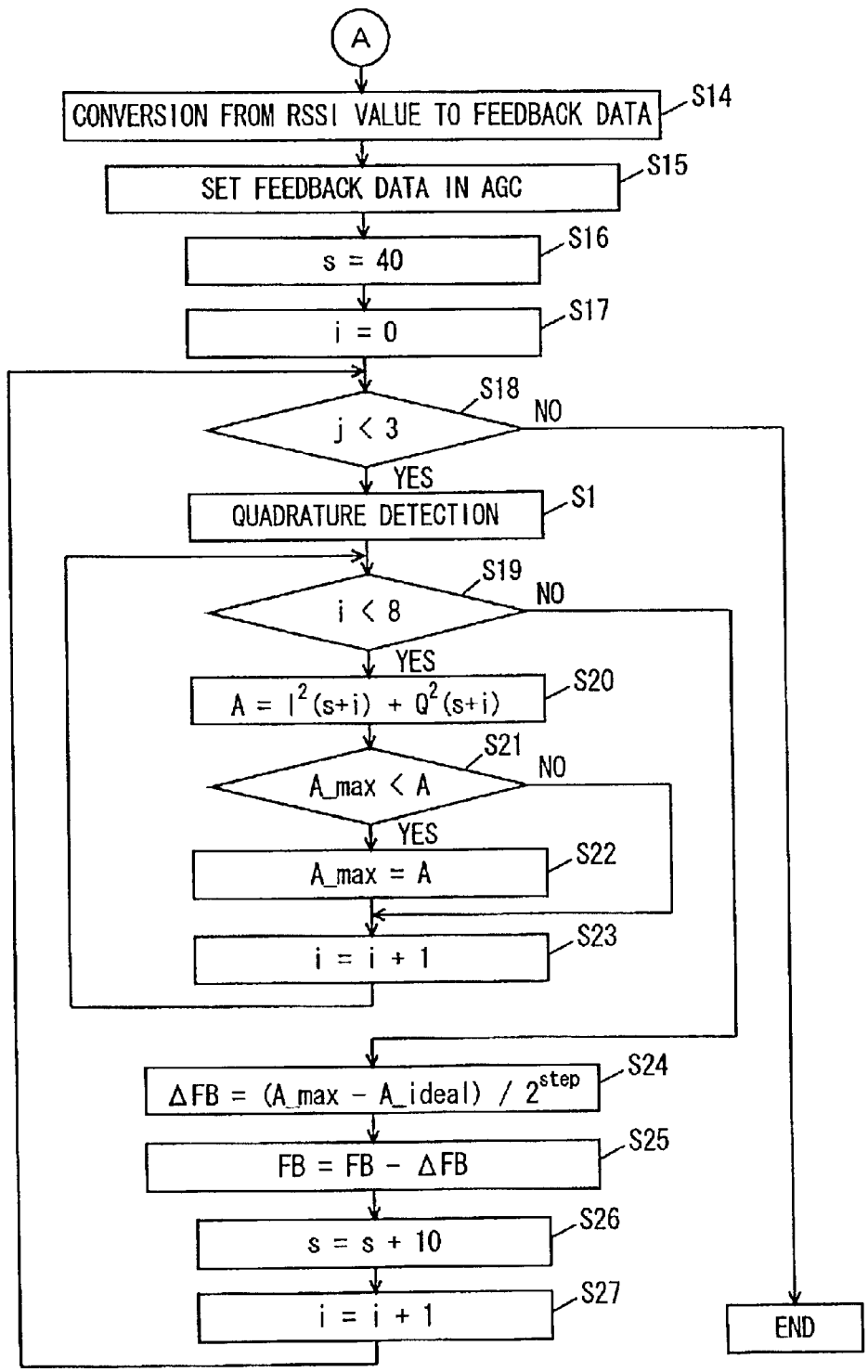
FIG. 7 is a flow chart partially illustrating the gain control method in accordance with the third and fourth embodiments of the present invention.

FIG. 5 is a functional block diagram functionally illustrating the radio apparatus according to a third embodiment of the present invention. FIG. 6 is a flow chart illustrating a part of the gain control method in accordance with the third embodiment of the present invention. FIG. 7 is a flow chart illustrating the remaining part of the gain control method in accordance with the third embodiment of the present invention.

First referring to FIG. 5, RSSI detection unit 16 detects the RSSI of the signal received at antenna 1 as illustrated with reference to FIG. 3.

A feedback data switch unit 19 provides feedback data read from the feedback data conversion unit 17 at the start of reception to the gain control input of AGC amplifier 2 as an initial value depending on RSSI of the signal from the mobile terminal unit and switches the feedback data input into the gain control input of AGC amplifier 2 from a first gain control feedback unit in which the reception level converges slow to a second gain control feedback unit in which reception level converges fast. The switching is carried out, for example, when the RSSI decreases by 20 dB$\mu$V or more or increases by 3 dB$\mu$V or more as compared with the previous frame.

It is noted that the first gain control feedback unit is basically formed of AGC amplifier 2, reception level detection unit 6, feedback data calculator 7, memory 8 and memory 9, and adapts the calculated feedback data to a reception value for the next frame. Furthermore, the second gain control feedback unit is basically formed of AGC amplifier 2, reception level detection unit 12, feedback data calculator 13, memory 14 and memory 15, and immediately adapts the calculated feedback data to the frame being received at present. The difference in the convergence rate results from the difference in the step constants stored in memories 9, 15.

Next referring to FIGS. 6 and 7, the gain control method in accordance with the third embodiment will be described.

At step S28 in FIG. 6, the RSSI of the signal received at the antenna end from the mobile terminal unit that is detected at step S13 is compared between frames. In this case, the present RSSI is compared to the stored RSSI of the signal received one frame before that frame. If the amount of increase is greater than a prescribed threshold A, for example, greater than 5 dB$\mu$V, or if the amount of decrease is greater than a prescribed threshold B, for example, greater than 10 dB$\mu$V, the gain control in which the reception level converges to an ideal value fast is carried out (see FIG. 7). If not, the gain control in which the reception level converges to an ideal value slowly is carried out (see FIG. 6). It is noted that the process in FIG. 6 is approximately same as the conventional example in FIG. 12, and the process in FIG. 7 is approximately same as the second embodiment in FIG. 4. Therefore, description of these processes is not repeated.

In this manner, in accordance with the third embodiment, the gain convergence rate of AGC can be optimized by switching the feedback data to AGC amplifier 2 depending on RSSI.

(Fourth Embodiment)

Figure 8:
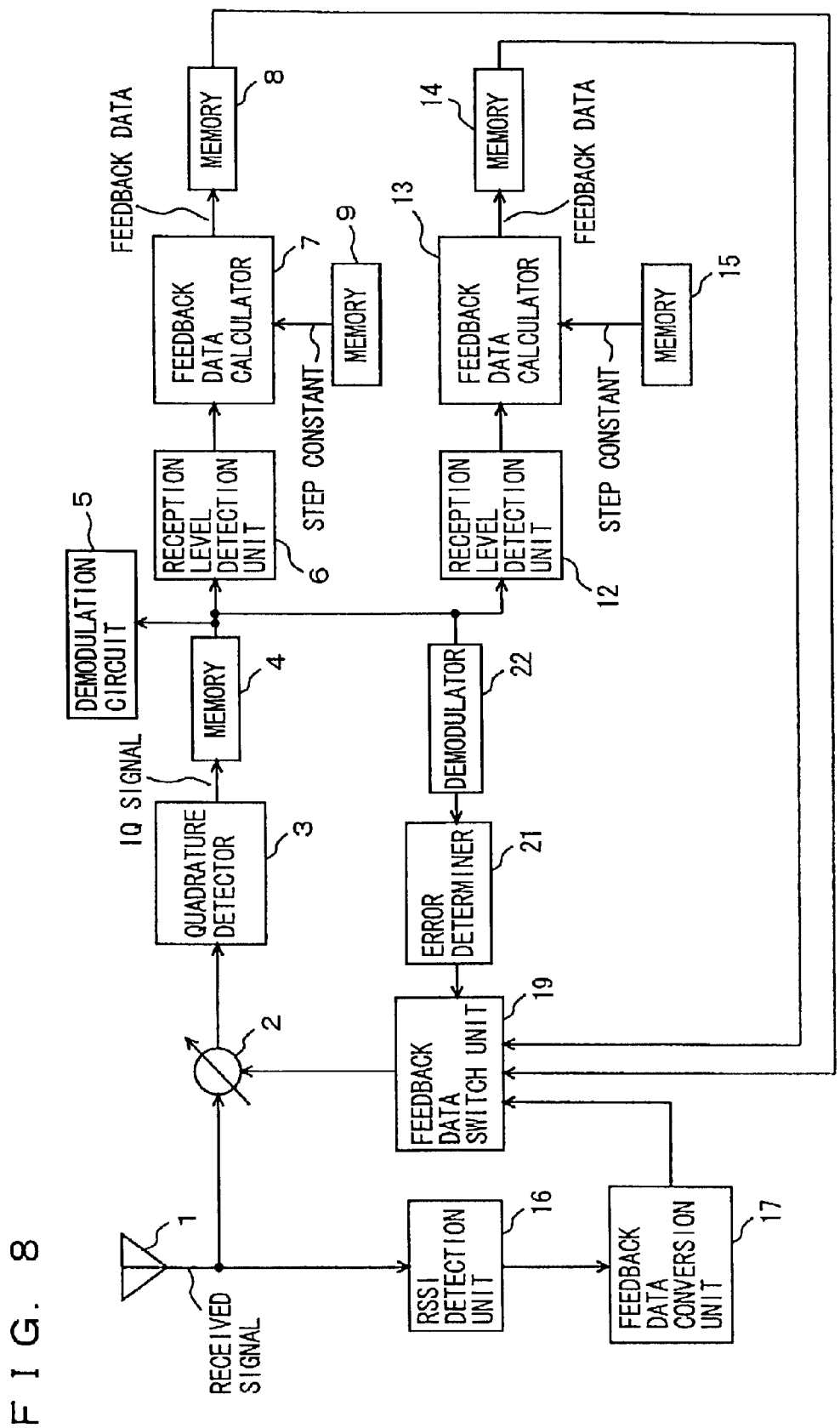
FIG. 8 is a functional block diagram functionally illustrating the radio apparatus in accordance with the fourth embodiment of the present invention.
Figure 9:
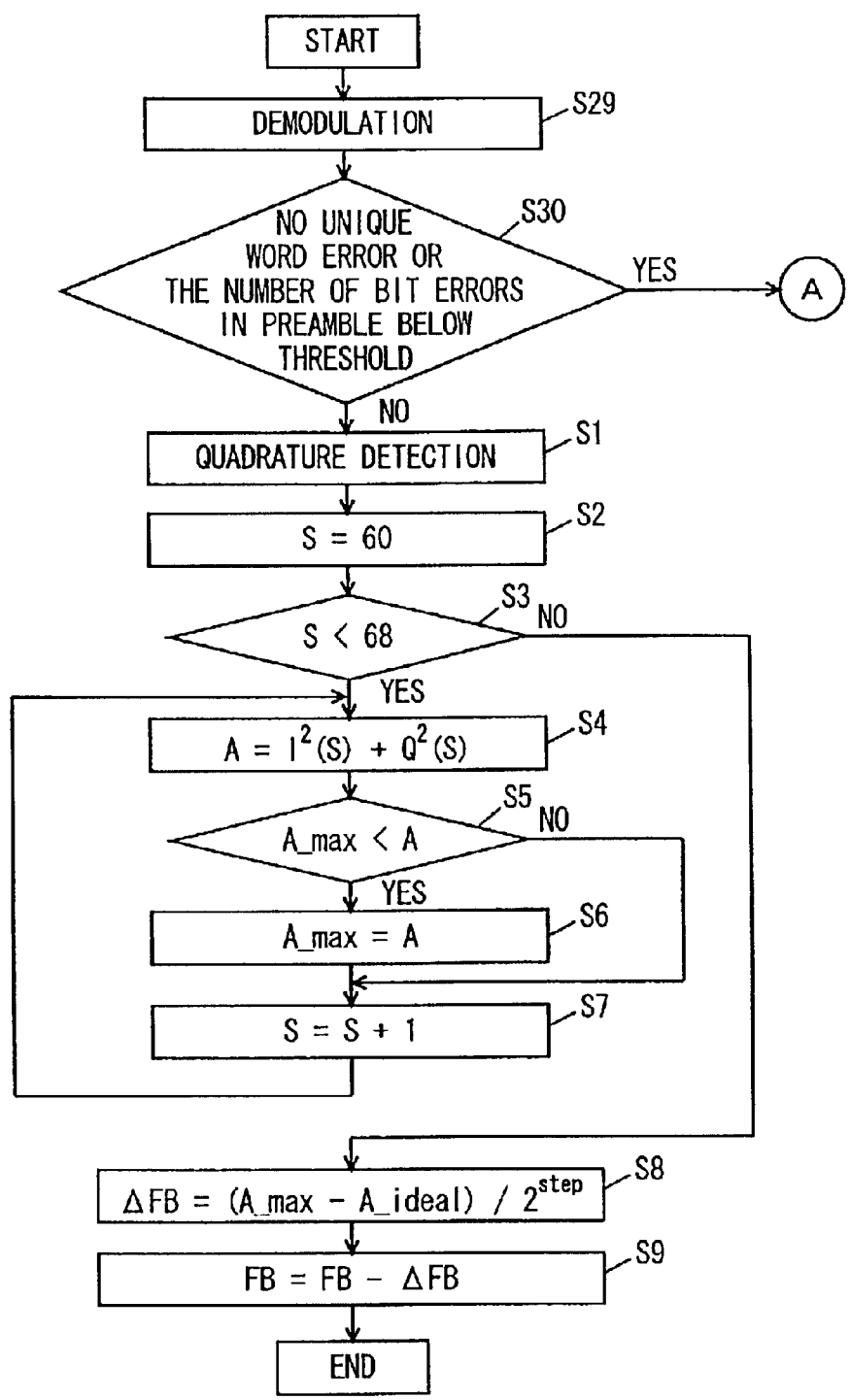
FIG. 9 is a flow chart illustrating the gain control method in accordance with the fourth embodiment of the present invention.

FIG. 8 is a functional block diagram functionally illustrating the radio apparatus in accordance with a fourth embodiment of the present invention. FIG. 9 is a flow chart partially illustrating the gain control method in accordance with the fourth embodiment of the present invention. It is noted that the radio apparatus shown in FIG. 8 is same as the radio apparatus in accordance with the third embodiment shown in FIG. 5 except the following points.

First referring to FIG. 8, a feedback data switch unit 20 makes a switch from the first gain control feedback unit in which convergence of the reception level is slow to the second gain control feedback unit in which convergence of the reception level is fast, when it is determined that the signal from a new mobile terminal unit is received, in addition to setting of an initial value of feedback data based on RSSI described in the second embodiment.

It is determined that a signal is received from a new mobile terminal unit as follows. When the signal is regarded as being received from a new mobile terminal unit and is demodulated, resulting in that there is no unique word error and the number of bit errors in a preamble portion is less than a prescribed number of bits, feedback data switch unit 20 determines that a signal is being received from the new mobile terminal unit and switches the gain control method.

Referring now to FIGS. 7 and 9, the gain control method in accordance with the fourth embodiment will be described.

At step S29 in FIG. 9, upon regarding a signal as being received from a new mobile terminal unit, demodulation is carried out.

At step S30, if the signal demodulated at step S29 has no unique word error or if the number of bit errors in a preamble portion is not more than a prescribed threshold, for example, two bits or less, the gain control in which the reception level converges to an ideal value fast (see FIG. 7) is carried out. If not, the gain control in which the reception level converges to an ideal value slow (see FIG. 9) is carried out. It is noted that the process in FIG. 7 is approximately same as the second embodiment in FIG. 4 and the process in FIG. 9 is approximately same as the conventional example in FIG. 12. Therefore, description of these processes will not be repeated.

In this manner, in accordance with the fourth embodiment, the gain convergence rate of AGC can be optimized by switching the gain control method when it is determined that a signal is received from a new mobile terminal.

(Fifth Embodiment)

Figure 10:
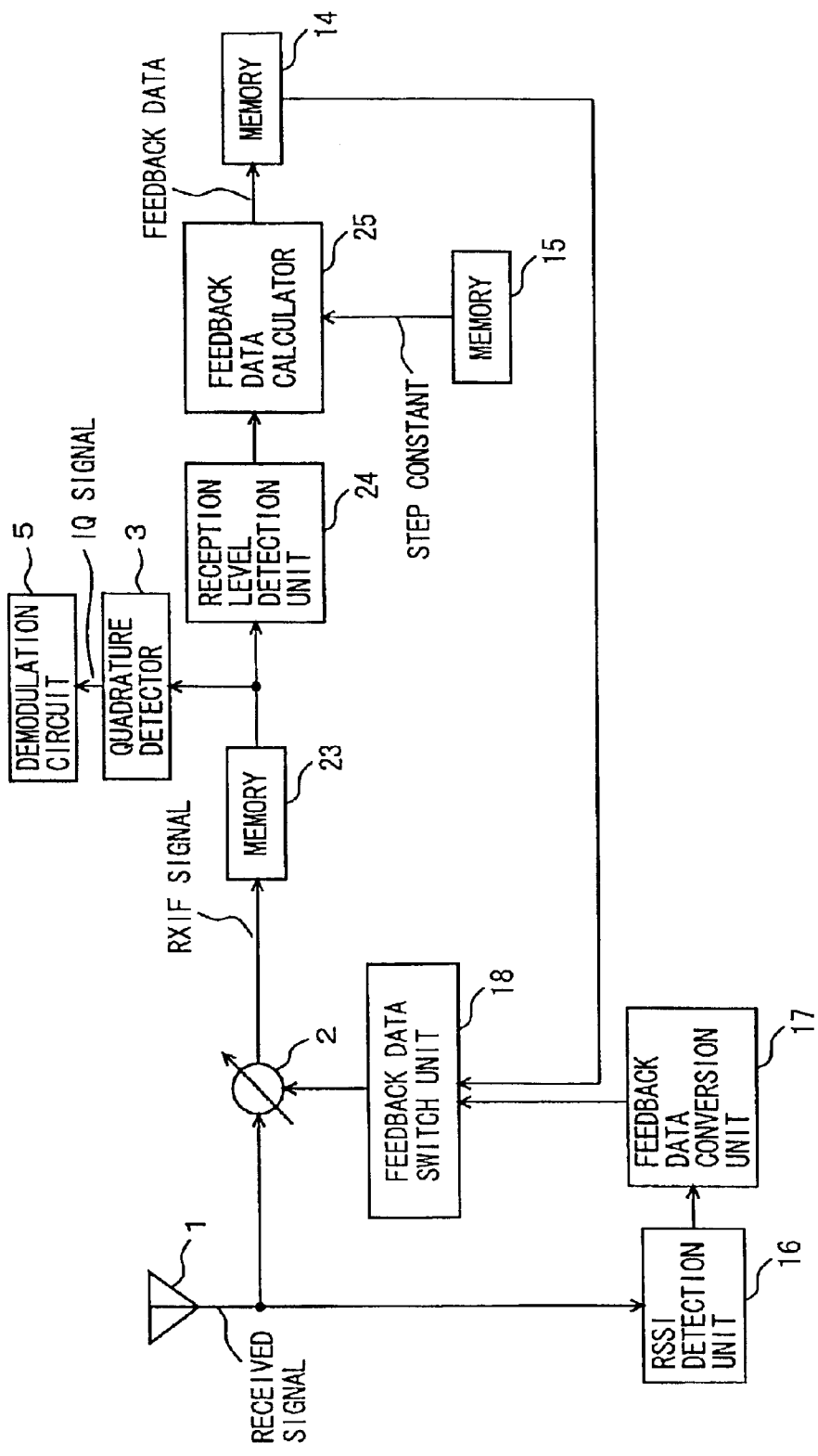
FIG. 10 is a functional block diagram functionally illustrating the radio apparatus in accordance with a fifth embodiment of the present invention.

FIG. 10 is a functional block diagram functionally illustrating the radio apparatus in accordance with a fifth embodiment of the present invention.

A reception level detection unit 24 calculates a reception level with amplitude of RXIF signal before passing through quadrature detector 3. The remaining process is same as the gain control method in accordance with the second embodiment. It is noted that a reception level can be detected using RXIF signal also in the first, third and fourth embodiments, and a similar effect can be obtained as using RXIQ signal.

As described above, in accordance with the present invention, a reception level can be converged to an ideal value by appropriately controlling the convergence rate of AGC even under environments in which the reception level is largely fluctuated due to the effects of fading, reception of a signal from a new mobile terminal, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radio apparatus carrying out automatic gain control for a signal from a mobile terminal unit, comprising:
    a gain control feedback circuit performing automatic gain control on said signal depending on a level of said signal;
    a fading rate estimation unit estimating a fading rate of the mobile terminal unit; and
    a step constant determiner determining an optimum step constant which decides a gain of said gain control feedback circuit depending on the fading rate estimated by said fading rate estimation unit, wherein
        said gain control feedback circuit includes a feedback data calculator calculating feedback data which defines a gain of said gain control feedback circuit based on said signal level and the optimum step constant as determined by said step constant determiner.

2. The radio apparatus according to claim 1, wherein said fading rate estimation unit calculates a reception response vector of the signal from the mobile terminal unit and estimates a fading rate from a correlation value of said reception response vectors between frames.

3. The radio apparatus according to claim 1, wherein said step constant determiner decides an optimum step constant at the fading rate estimated by said fading rate estimation unit based on an association table of preliminarily obtained fading rates and step constants.

4. The radio apparatus according to claim 1, wherein said feedback data calculator calculates feedback data in a next frame by obtaining a value of difference between a value of said signal level and an ideal value, dividing the value of difference by a prescribed constant a number of times corresponding to said step constant, followed by multiplication by a prescribed coefficient, thereby calculating an amount of change in feedback data, and adding the amount of change to feedback data at the time of receiving a previous frame.

5. A radio apparatus carrying out automatic gain control for a signal from a mobile terminal unit, comprising:
    a gain control feedback circuit performing automatic gain control on said signal depending on a level of said signal;
    a received signal strength detection unit detecting a received signal strength of the signal from the mobile terminal unit, at an antenna end of said radio apparatus;
    a feedback data conversion unit carrying out conversion from the received signal strength detected by said received signal strength detection unit to optimum feedback data which decides a gain of said gain control feedback circuit based on an association table of preliminary obtained received signal strength and feedback data; and
    a feedback data switch unit selecting the optimum feedback data converted by said feedback data conversion unit as an initial value of feedback data of said gain control feedback circuit.

6. A radio apparatus carrying out automatic gain control for a signal from a mobile terminal unit, comprising:
    a gain control feedback circuit performing automatic gain control on said signal depending on a level of said signal,
    said gain control feedback circuit including
        a first gain control circuit supplying first feedback data allowing the level of said signal to converge to an ideal value slowly, and a second gain control circuit supplying second feedback data allowing the level of said signal to converge to an ideal value fast;

a received signal strength detection unit detecting a received signal strength of the signal from the mobile terminal unit at an antenna end of said radio apparatus; and a feedback data switch unit selecting said first feedback data or said second feedback data depending on a detection result from said received signal strength detection unit.

7. The radio apparatus according to claim 6, wherein said feedback data switch unit makes a switch from said first feedback data to said second feedback data when fluctuation of the received signal strength detected by said received signal strength detection unit decreases to a prescribed threshold or below or increases to a prescribed threshold or above.

8. A radio apparatus carrying out automatic gain control for a signal from a mobile terminal unit, comprising:

a gain control feedback circuit performing automatic gain control on said signal depending on a level of said signal, said gain control feedback circuit including a first gain control circuit supplying first feedback data allowing the level of said signal to converge to an ideal value slowly, and a second gain control circuit supplying second feedback data allowing the level of said signal to converge to an ideal value fast;

a new terminal detector detecting whether a signal is received from a new mobile terminal unit; and a feedback data switch unit selecting said first feedback data or said second feedback data depending on a detection result from said new terminal detector.

9. The radio apparatus according to claim 8, wherein said new terminal detector includes a demodulation circuit demodulating a specific signal from a new mobile terminal unit, and an error determiner determining whether an error exists in the signal demodulated by said demodulation circuit and if no error exists, determining that a signal is received from a new mobile terminal unit.

10. The radio apparatus according to claim 9, wherein said error determiner determines that a signal is received from a new mobile terminal unit if a unique word error does not exist in the signal demodulated in said demodulation circuit.

11. The radio apparatus according to claim 9, wherein said error determiner determines that a signal is received from a new mobile terminal unit if the number of bit errors in a preamble portion is equal to or smaller than a prescribed threshold in the signal demodulated in said demodulation circuit.

12. The radio apparatus according to any of claims 1, 5, 6, or 8, wherein said gain control feedback circuit includes a reception level detection unit detecting the level of said signal, and said reception level detection unit calculates an amplitude value for each IQ signal during a prescribed period of a received signal and regards a maximum amplitude value among said amplitude values as a reception level of said received signal.

13. The radio apparatus according to any of claims 1, 5, 6, or 8, wherein said gain control feedback circuit includes a reception level detection unit detecting the level of said signal, and said reception level detection unit calculates an amplitude value for each IF signal during a prescribed period of a received signal and regards a maximum amplitude value among said amplitude values as a reception level of said received signal.

14. A gain control method in a radio apparatus carrying out automatic gain control for a signal from a mobile terminal unit, comprising the steps of:

performing automatic gain control on said signal depending on a level of said signal;

estimating a fading rate of the mobile terminal unit; and determining an optimum step constant which decides a gain of said automatic gain control, depending on said estimated fading rate, wherein said step of carrying out automatic gain control includes the step of calculating feedback data which defines a gain of said automatic gain control, depending on said signal level and said optimum step constant as determined.

15. The gain control method according to claim 14, wherein said step of estimating a fading rate includes the step of calculating a reception response vector of the signal from the mobile terminal unit and estimating a fading rate from a correlation value of said reception response vectors between frames.

16. The gain control method according to claim 14, wherein said step of determining an optimum step constant includes the step of deciding an optimum step constant at said estimated fading rate based on an association table of preliminary obtained fading rates and step constants.

17. The gain control method according to claim 14, wherein said step of calculating feedback data includes the step of calculating feedback data in a next frame by obtaining a value of difference between a value of said signal level and an ideal value, dividing the value of difference by a prescribed constant a number of times corresponding to said step constant, followed by multiplication by a prescribed coefficient, thereby calculating an amount of change in feedback data, and adding the amount of change to feedback data at the time of receiving a previous frame.

18. A gain control method in a radio apparatus carrying out automatic gain control for a signal from a mobile terminal unit, comprising the steps of:

performing automatic gain control on said signal depending on a level of said signal;

detecting a received signal strength of the signal from the mobile terminal unit at an antenna end of said radio apparatus;

carrying out conversion from said detected, received signal strength to optimum feedback data which decides a gain of said automatic gain control based on an association table of preliminarily obtained received signal strengths and feedback data; and selecting said converted optimum feedback data as an initial value of feedback data.

19. A gain control method in a radio apparatus carrying out automatic gain control for a signal from a mobile terminal unit, comprising the steps of:

performing automatic gain control on said signal depending on a level of said signal, said step of performing automatic gain control including
a first step of supplying first feedback data allowing the level of said signal to converge to an ideal value slowly, and
a second step of supplying second feedback data allowing the level of said signal to converge to an ideal value fast;

detecting a received signal strength of the signal from the mobile terminal unit, at an antenna end of said radio apparatus; and selecting said first feedback data or said second feedback data depending on a result of said detection.

20. The gain control method according to claim 19, wherein
said step of selecting feedback data includes the step of making a switch from said first feedback data to said second feedback data when fluctuation of said detected, received signal strength decreases to a prescribed threshold or below or increases to a prescribed threshold or above.

21. A gain control method in a radio apparatus carrying out automatic gain control for a signal from a mobile terminal unit, comprising the steps of:

performing automatic gain control on said signal depending on a level of said signal, said step of performing automatic gain control including
a first step of supplying first feedback data allowing the level of said signal to converge to an ideal value slowly, and
a second step of supplying second feedback data allowing the level of said signal to converge to an ideal value fast;

detecting whether a signal is received from a new mobile terminal unit; and selecting said first feedback data or said second feedback data depending on a result of said detection.

22. The gain control method according to claim 21, wherein
said step of detecting a new mobile terminal unit includes the steps of
demodulating a specific signal from a new mobile terminal unit, and
determining whether an error exists in the demodulated signal and if no error exists, determining that a signal is received from a new mobile terminal unit.

23. The gain control method according to claim 22, wherein
said step of determining whether an error exists includes the step of determining that a signal has been received from a new mobile terminal unit when a unique word error does not exist in said demodulated signal.

24. The gain control method according to claim 22, wherein
said step of determining whether an error exists includes the step of determining that a signal has been received from a new mobile terminal unit if the number of bit errors in a preamble portion is equal to or smaller than a prescribed threshold in said demodulated signal.

25. The gain control method according to any of claims 14, 18, 19, or 21, wherein
said step of performing automatic gain control includes the step of detecting the level of said signal, and
said step of detecting the level of said signal has the step of calculating an amplitude value for each IQ signal during a prescribed period of a received signal and regarding a maximum amplitude value among said amplitude values as a reception level of said received signal.

26. The gain control method according to any of claims 14, 18, 19, or 21, wherein
said step of performing automatic gain control includes the step of detecting the level of said signal, and
said step of detecting the level of said signal has the step of calculating an amplitude value for each IF signal during a prescribed period of a received signal and regarding a maximum amplitude value among said amplitude values as a reception level of said received signal.

* * * * *